United States Patent
Deval et al.

(10) Patent No.: US 9,607,978 B2
(45) Date of Patent: Mar. 28, 2017

(54) ESD-PROTECTION CIRCUIT FOR INTEGRATED CIRCUIT DEVICE

(71) Applicant: Microchip Technology Incorporated, Chandler, AZ (US)

(72) Inventors: Philippe Deval, Lutry (CH); Marija Fernandez, Lausanne (CH); Patrick Besseux, Mont-sur-Rolle (CH); Rohan Braithwaite, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/167,331

(22) Filed: Jan. 29, 2014

(65) Prior Publication Data

US 2014/0210007 A1 Jul. 31, 2014

Related U.S. Application Data

(60) Provisional application No. 61/758,590, filed on Jan. 30, 2013.

(51) Int. Cl.
*H01L 27/02* (2006.01)
*H01L 29/66* (2006.01)
*H01L 27/12* (2006.01)
*H01L 29/739* (2006.01)
*H01L 29/74* (2006.01)

(52) U.S. Cl.
CPC ...... *H01L 27/0266* (2013.01); *H01L 27/1203* (2013.01); *H01L 29/7393* (2013.01); *H01L 29/7436* (2013.01)

(58) Field of Classification Search
CPC ............. H01L 29/7393; H01L 29/7436; H01L 27/0266; H01L 27/1203; H01L 27/06; H01L 27/0262; H01L 29/66121
See application file for complete search history.

(56) References Cited

U.S. PATENT DOCUMENTS

| | | | | |
|---|---|---|---|---|
| 4,199,774 A | * | 4/1980 | Plummer | H01L 27/088 257/124 |
| 4,779,125 A | * | 10/1988 | Remmerie et al. | 257/138 |
| 4,947,226 A | * | 8/1990 | Huang et al. | 257/122 |
| 6,144,070 A | * | 11/2000 | Devore | H01L 23/60 257/343 |
| 6,365,932 B1 | * | 4/2002 | Kouno et al. | 257/341 |
| 6,439,514 B1 | * | 8/2002 | Yamaguchi et al. | 257/500 |
| 7,719,026 B2 | * | 5/2010 | Lou et al. | 257/173 |

(Continued)

FOREIGN PATENT DOCUMENTS

| | | | | |
|---|---|---|---|---|
| FR | WO 2014041388 A1 | * | 3/2014 | ......... H01L 29/7436 |
| WO | 2013/013035 A1 | | 1/2013 | ............. H01L 27/02 |

OTHER PUBLICATIONS

International Search Report and Written Opinion, Application No. PCT/US2014/013671, 11 pages, Jun. 6, 2014.

*Primary Examiner* — Jarrett Stark
*Assistant Examiner* — Bitew Dinke
(74) *Attorney, Agent, or Firm* — Slayden Grubert Beard PLLC

(57) ABSTRACT

A double-diffused metal oxide semiconductor (DMOS) structure is configured as an open drain output driver having electrostatic discharge (ESD) protection and a reverse voltage blocking diode inherent in the structure and without requiring metal connections for the ESD and reverse voltage blocking diode protections.

46 Claims, 15 Drawing Sheets

(56) References Cited

U.S. PATENT DOCUMENTS

| | | | |
|---|---|---|---|
| 8,283,727 B1* | 10/2012 | Walker | H01L 29/0649 257/355 |
| 8,502,344 B2* | 8/2013 | Lu | 257/557 |
| 8,664,690 B1* | 3/2014 | Chen et al. | 257/107 |
| 8,890,248 B2* | 11/2014 | Pauletti | H01L 27/0262 257/173 |
| 2001/0038125 A1* | 11/2001 | Ohyanagi et al. | 257/347 |
| 2002/0043699 A1* | 4/2002 | Akiyama | 257/575 |
| 2002/0050613 A1* | 5/2002 | Rumennik | H01L 29/0619 257/325 |
| 2002/0076876 A1* | 6/2002 | Ker | H01L 21/82342 438/218 |
| 2002/0109190 A1* | 8/2002 | Ker | H01L 29/87 257/355 |
| 2005/0133871 A1* | 6/2005 | Ker et al. | 257/355 |
| 2006/0255406 A1* | 11/2006 | Ichijo et al. | 257/347 |
| 2007/0069308 A1* | 3/2007 | Ko | H01L 29/402 257/401 |
| 2007/0120190 A1* | 5/2007 | Schwantes et al. | 257/355 |
| 2008/0237631 A1* | 10/2008 | Watanabe | 257/141 |
| 2009/0032838 A1* | 2/2009 | Tseng | H01L 27/0262 257/133 |
| 2009/0179270 A1* | 7/2009 | Chen | H01L 29/0653 257/355 |
| 2012/0241900 A1* | 9/2012 | Chen et al. | 257/503 |
| 2013/0020646 A1* | 1/2013 | Deval et al. | 257/355 |
| 2013/0214821 A1* | 8/2013 | Chen et al. | 327/109 |
| 2013/0228868 A1* | 9/2013 | Stribley | 257/360 |
| 2014/0054642 A1* | 2/2014 | Edwards | H01L 27/0262 257/124 |
| 2014/0111892 A1* | 4/2014 | Chen et al. | 361/56 |

* cited by examiner

ESD-PROTECTION CIRCUIT FOR INTEGRATED CIRCUIT DEVICE

RELATED PATENT APPLICATION

This application claims priority to commonly owned U.S. Provisional Patent Application Ser. No. 61/758,590; filed Jan. 30, 2013; entitled "ESD-Protection Circuit for Integrated Circuit Device," by Philippe Deval, Marija Fernandez and Patrick Besseux; and is hereby incorporated by reference herein for all purposes.

TECHNICAL FIELD

The present disclosure relates to an electrostatic discharge protection circuit within integrated circuit devices that are capable of, for example, interfacing to a Local Interconnect Network (LIN) bus and the like, e.g., as used in automotive electronics, and more particularly, to achieving high electrostatic discharge (ESD) robustness when handled, plugged into or removed from the LIN bus and the like, and having high electro-magnetic interference (EMI) immunity when operating on the LIN bus and the like.

BACKGROUND

The ever-increasing importance of electronics in automobiles brings with it a growing challenge and need for low-cost, reliable electronic systems and subsystems that require input-output devices that interface with sensors and actuators. These systems and subsystems are not isolated, and must communicate with each other.

Historically, automotive electronics have been built up using discrete, smaller integrated circuits. They relied on proprietary, dedicated wire communication schemes, at least for many sensor systems, and directly wired power outputs to the actuators. This led to large printed-circuit boards (PCBs), large engine-control unit (ECU) housing sizes, and excessive wiring bundles. Wiring brings with it other problems since it consumes space, adds weight and expense, is subject to the vehicle's electromagnetic noise, and can be difficult to trouble shoot and maintain.

Fortunately, advances in vehicle-networking standards and mixed-signal semiconductor processes are addressing these issues and introducing new possibilities to distribute intelligent systems throughout a vehicle. The trend in vehicle-networking standardization includes the wide adoption of Controller Area Network (CAN) and the Local Interconnect Network (LIN) architecture.

These network standards are providing a balance between performance and cost optimization across automotive systems. CAN provides a high-speed network for chassis, power-train and body-backbone communications, while LIN answers the need for a simple network for sensor and actuator subsystems that reduces cost and improves robustness through standardization. The wide use of CAN and the availability of LIN coincides with advances in mixed-signal semiconductor-process technologies that can bring together all the functionality needed for smaller automotive systems onto a single integrated circuit (IC), or a few ICs for more advanced systems.

While LIN was originally targeted for the vehicle's body electronics, it is proving its value in new ways with many implementations outside of body electronics. Among the automotive-electronic bus standards available, LIN provides the best solution for the communication needs of most sensors and actuators which are normally dedicated to a single system. They can be viewed as subsystems and are well served by LIN, which has been defined to fill a sub-network role in the vehicle. The maximum LIN specified data rate of twenty kilobits per second (kbps) is sufficient for most sensors and actuators. LIN is a time-triggered, master-slave network, eliminating the need for arbitration among simultaneously reporting devices. It is implemented using a single wire communications bus, which reduces wiring and harness requirements and thus helps save weight, space and cost.

Defined specifically for low-cost implementation of vehicle sub-network applications by the LIN Consortium, the LIN standard aligns well to the integration capabilities of today's mixed-signal semiconductor processes. The LIN protocol achieves significant cost reduction since it is fairly simple and operates via an asynchronous serial interface (UART/SCI), and the slave nodes are self-synchronizing and can use an on-chip RC oscillator instead of crystals or ceramic resonators. As a result, silicon implementation is inexpensive, making LIN very suitable for the mixed-signal process technologies typically used to manufacture signal-conditioning and output ICs for automotive subsystems.

The LIN master node is normally a bridge node of the LIN sub-network to a CAN network, and each vehicle will typically have several LIN sub-networks. The master LIN node has higher complexity and control, while the slave LIN nodes are typically simpler, enabling their integration in single IC subsystems. Through the use of standardized vehicle-networking architectures, it is possible to build a feature- and diagnostic-rich system that requires only three wires (LIN, battery and ground)

For obvious reasons of reliability and safe operation a very high immunity for both ESD (Electro Static Discharge) and EMI (Electro Magnetic Interference) is required for all of the LIN modules. This high ESD and EMI immunity specially applies to the electrical nodes (pins) of a LIN module that are connected to the external world (e.g., battery pin, LIN pin, etc.). However, pins of a CAN module or any other pin exposed to ESD and EMI may need similar protection.

The pins of a LIN module that are connected to the system (external world) are highly exposed to ESD discharge when the module is handled or plugged into the system. A LIN module must be able to be safely installed or removed by any one. LIN and CAN spec require bus voltage operation outside of the supply range. Therefore series reverse blocking diodes are mandatory for the LIN and CAN bus output ports. LIN and CAN spec require high energy ESD robustness (8 KV HBM/6 KV iec61000.4) and high voltage range capability (+/−45 to +/−60V) on bus ports. This induces very large area for the bus drivers and series reverse blocking diodes, which results in costly parts. Any solution that reduces the layout area of LIN and CAN drivers would beneficial and save on fabrication costs.

SUMMARY

Therefore, a need exists for integration of ESD protection of an external electrical connection node of an integrated circuit device that is easy to implement during fabrication, reduces layout area of LIN and CAN drivers thereby saving fabrication and silicon die costs, and provides self-protected driving and reverse blocking capabilities in a very compact structure.

According to an embodiment, an open drain output driver cell having electro-static discharge protection may comprise: an N− well; a first P− body diffused in the N− well, wherein the first P− body comprises a first P+ diffusion and a first N+ diffusion; a second P− body diffused in the N-well, wherein the second P− body comprises a second P+ diffusion and a second N+ diffusion; a first gate and a first insulating oxide over a portion of the first P-body and a portion of the N− well, wherein the first gate provides for control of the output driver cell; a second gate and a second insulating oxide over a portion of the second P-body and a portion of the N-well; the first P+ diffusion and the first N+ diffusion may be connected together to provide a source and body contact for the output driver cell; and the second P+ diffusion, the second N+ diffusion and the second gate may be connected together to provide a drain for the output driver cell; wherein an electro-static discharge (ESD) and reverse voltage protection diode may be formed between the first and second P− bodies.

According to a further embodiment, the second gate may be connected to the second P+ diffusion and the second N+ diffusion through a resistor. According to a further embodiment, the second gate may be connected to the second P+ diffusion and the second N+ diffusion through a triggering circuit. According to a further embodiment, an N− well region between regions of the two P-bodies creates a common drift region. According to a further embodiment, the N− well common drift region between the two P-body regions may have no diffusion contact, thereby making its structure as narrow as possible. According to a further embodiment, an N+ diffusion contact may be inserted into the N− well common drift region. According to a further embodiment, an N+ diffusion contact may be inserted into the N− well common drift region and provides access to the N− well common drift region. According to a further embodiment, an N+ diffusion contact may be inserted into the N− well common drift region and may be connected to a distributed base connection. According to a further embodiment, the first P+ diffusion and the first N+ diffusion may be connected to a negative supply. According to a further embodiment, the first P+ diffusion and the first N+ diffusion may be connected to a source side distributed base.

According to a further embodiment, a third P+ diffusion and a third N+ diffusion may be added to the first P− body. According to a further embodiment, the third P+ diffusion and the third N+ diffusion may be connected to a negative supply. According to a further embodiment, the second P+ diffusion and the second N+ diffusion may be connected to the open drain output. According to a further embodiment, the second P+ diffusion and the second N+ diffusion may be connected to a drain side distributed base. According to a further embodiment, a fourth P+ diffusion and a fourth N+ diffusion may be added to the second P− body. diffusion may be added to the first P− body the fourth P+ diffusion and the fourth N+ diffusion may be connected to the open drain output.

According to a further embodiment, the N− well may be fabricated on an N-type buried layer (NBL). According to a further embodiment, high voltage wells may surround the N− well. According to a further embodiment, the N− well may be fabricated on a P-type substrate. According to a further embodiment, the N− well may be fabricated on a P-type wafer. According to a further embodiment, the N− well may be fabricated on a Buried OXide (BOX) layer.

According to a further embodiment, a Local Interconnect Network (LIN) bus driver may comprise the open drain output driver cell described hereinabove.

According to another embodiment, an open drain output driver cell having electro-static discharge protection may comprise: a P− well; a first N− body diffused in the P− well, wherein the first N− body comprises a first N+ diffusion and a first P+ diffusion; a second N− body diffused in the P− well, wherein the second N− body comprises a second N+ diffusion and a second P+ diffusion; a first gate and a first insulating oxide over a portion of the first N-body and a portion of the P− well, wherein the first gate provides for control of the output driver cell; a second gate structure and a second insulating oxide over a portion of the second N-body and a portion of the P-well; the first N+ diffusion and the first P+ diffusion may be connected together to provide a source and body contact for the output driver cell; and the second N+ diffusion, the second P+ diffusion and the second gate may be connected together to provide a drain connection to the output driver cell; wherein an electro-static discharge (ESD) and reverse voltage protection diode may be formed between the first and second N− bodies.

According to a further embodiment, the second gate may be connected to the second N+ diffusion and the second P+ diffusion through a resistor. According to a further embodiment, the second gate may be connected to the second N+ diffusion and the second P+ diffusion through a triggering circuit. According to a further embodiment, the P− well region between the two N-body regions creates a common drift region. According to a further embodiment, the P− well common drift region between the two N-body regions may have no diffusion contact, thereby making its structure as narrow as possible. According to a further embodiment, a P+ diffusion contact may be inserted into the P− well common drift region. According to a further embodiment, a P+ diffusion contact may be inserted into the P− well common drift region and provide access to the P− well common drift region. According to a further embodiment, a P+ diffusion contact may be inserted into the P− well common drift region and may be connected to a distributed base connection. According to a further embodiment, the first P+ diffusion and the first N+ diffusion may be connected to a positive supply. According to a further embodiment, the first P+ diffusion and the first N+ diffusion may be connected to a source side distributed base.

According to a further embodiment, a third P+ diffusion and a third N+ diffusion diffusion may be added to the first N− body. According to a further embodiment, the third P+ diffusion and the third N+ diffusion may be connected to a positive supply. According to a further embodiment, the second P+ diffusion and the second N+ diffusion may be connected to the open drain output. According to a further embodiment, the second P+ diffusion and the second N+ diffusion may be connected to a drain side distributed base. According to a further embodiment, a fourth P+ diffusion and a fourth N+ diffusion may be added to the second N− body. According to a further embodiment, the fourth P+ diffusion and the fourth N+ diffusion may be connected to the open drain output.

According to a further embodiment, the P− well may be fabricated on an N-type buried layer (NBL). According to a further embodiment, high voltage wells may surround the P− well. According to a further embodiment, the P− well may be fabricated on an N-type substrate. According to a further embodiment, the P− well may be fabricated on an N-type wafer. According to a further embodiment, the P− well may be fabricated on a Buried OXide (BOX) layer.

According to yet another embodiment, a protection circuit for an integrated circuit device may comprise: a cell comprising two source regions and associated gates, wherein a first source region may be configured to be connected to a negative supply voltage and its gate may be driven by a control signal, and wherein the second source region may be connected with its gate, wherein the second source region acts as the drain output of the cell.

According to a further embodiment, the cell may be arranged within a high voltage well. According to a further embodiment, a buried layer may be arranged under the cell. According to a further embodiment, the second source region may form a reverse blocking diode and the first source region may be part of a MOS transistor coupled in series with the reverse blocking diode. According to a further embodiment, the first and second source region may be arranged within a well of a first conductivity type and comprise a body of a second conductivity type into which contact zones of the first and second conductivity type may be embedded. According to a further embodiment, the contact zones of a source region may be connected to a metal layer. According to a further embodiment, the contact zones may be connected to the metal layer with metal vias. According to a further embodiment, the first and second gate may be formed as a split gate.

According to still another embodiment, a protection circuit for an integrated circuit device may comprise: a cell comprising two lateral MOS transistors with a common drain region and two source regions and associated gates, wherein a first MOS transistor of the two lateral MOS transistors may be configured to be connected to a supply voltage via the first source region and its gate may be driven by a control signal, and wherein the second MOS transistor may be connected as a diode; wherein the gate may be coupled with the second source region; and wherein the second source/body region acts as the drain output of the cell.

According to a further embodiment, the common drain region may remain unconnected. According to a further embodiment, the second MOS transistor may form a reverse blocking diode in series with the first MOS transistor. According to a further embodiment, a common drain region may be adapted to provide access to an intermediate point between the first MOS transistor and the second MOS transistor functioning as the reverse blocking diode. According to a further embodiment, the cell may be arranged within a high voltage well. According to a further embodiment, a buried layer may be arranged under the cell. According to a further embodiment, the first and second source region may be arranged within a well of a first conductivity type and comprise a body of a second conductivity type into which contact zones of the first and second conductivity type may be embedded. According to a further embodiment, the contact zones of a source region may be connected to a metal layer. According to a further embodiment, the contact zones may be connected to the metal layer with metal vias. According to a further embodiment, the gates of the first and second MOS transistor may be formed as a split gate. According to a further embodiment, the supply voltage may be positive. According to a further embodiment, the supply voltage may be negative.

According to another embodiment, an open drain output driver cell having electro-static discharge protection may comprise: an N− well; a first P− body diffused in the N− well, wherein the first P− body comprises a first P+ diffusion and a first N+ diffusion; a second P− body diffused in the N− well, wherein the second P− body comprises a second P+ diffusion; a gate and an insulating oxide over a portion of the first P-body and a portion of the N− well, wherein the gate provides for control of the output driver cell; and the second P+ diffusion provides a connection to the output driver cell; wherein an electro-static discharge (ESD) and reverse voltage protection diode may be formed between the first and second P− bodies.

According to a further embodiment, a second N+ diffusion may be implemented into the second P− body. According to a further embodiment, the second P+ diffusion and the second N+ diffusion may be connected together to provide a connection for the output of the driver cell.

According to yet another embodiment, an open drain output driver cell having electro-static discharge protection may comprise: a P− well; a first N− body diffused in the P− well, wherein the first N− body comprises a first P+ diffusion and a first N+ diffusion; a second N− body diffused in the P− well, wherein the second N− body comprises a second N+ diffusion; a gate and an insulating oxide over a portion of the first N-body and a portion of the P− well, wherein the gate provides for control of the output driver cell; and the second N+ diffusion provides a connection to the output driver cell; wherein an electro-static discharge (ESD) and reverse voltage protection diode may be formed between the first and second N− bodies.

According to a further embodiment, a second P+ diffusion may be implemented into the second N− body. According to a further embodiment, the second P+ diffusion and the second N+ diffusion may be connected together to provide a connection for the output of the driver cell.

BRIEF DESCRIPTION OF THE DRAWINGS

A more complete understanding of the present disclosure may be acquired by referring to the following description taken in conjunction with the accompanying drawings wherein.

Figure 1:
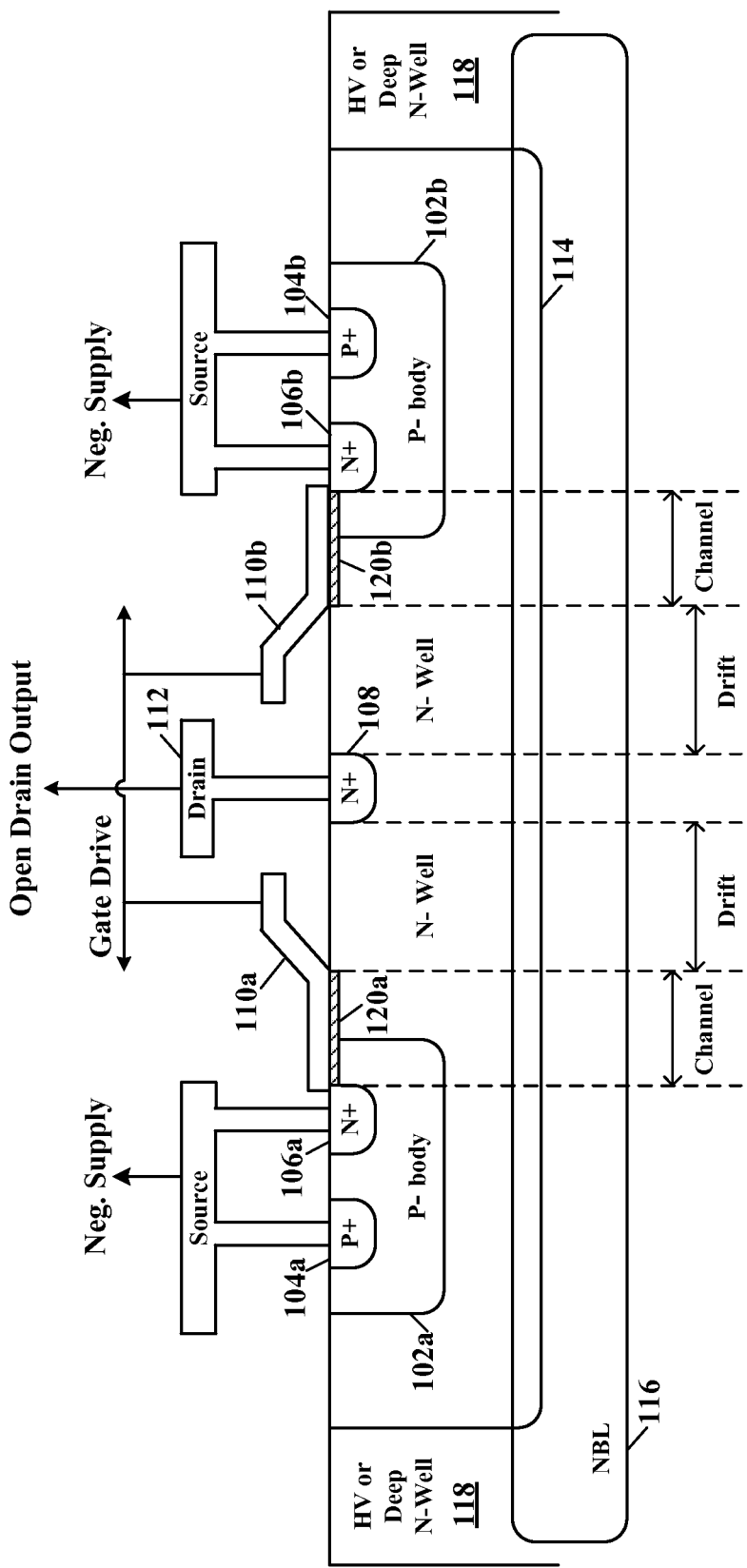
FIG. 1 illustrates a schematic cross-section elevation of a conventional DMOS output driver cell.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, a hybrid device may provide self-protected driving and reverse voltage blocking capabilities in a very compact structure that results in a very cost efficient solution. According to various embodiments, a protection circuit may be based on a central drain double-diffused metal-oxide-semiconductor (DMOS) transistor. The protection circuit may also work for both nDMOS and pDMOS in a silicon-on-insulator (SOI) process (CAN bus) and for nDMOS with a bulk process (LIN bus). Specific example embodiments will be described hereinafter for nDMOS (LIN bus) integrated circuits.

According to various embodiments, a compact and self ESD protected output stage may be provided for LIN and CAN busses or other devices that require similar protection. LIN and CAN products have very high requirements in term of ESD robustness and need reverse blocking capability on their LIN/CAN bus ports. Both products require as well high voltage capability on their LIN/CAN bus ports (+/−45V to +/−60V). This usually implies complex output structures that require large area to be implemented: In most of the cases four (4) independent devices are required: the driver plus its ESD protection and the reverse blocking diode plus its dedicated ESD protection. All these devices are large due to specific constraints (HV capability and low drop-out for the driver and reverse blocking diode up to very high silicon temperatures (>160° C.) and, very high ESD robustness for the protections). The routing between these devices further increase the area requirements.

The proposed solution, according to various embodiments, may include all of the aforementioned functions in a compact layout structure that inherently offers a SCR structure. Therefore it is very efficient for ESD, and thus self-protected. The SCR structure may be achieved through the way a reverse blocking diode is implemented inside the drain of the driver (see FIG. 3). Thus no metal routing is required between the driver and the reverse blocking diode. Moreover the drift region of the driver and the reverse blocking diode may be merged. Consequently the series resistance of the device is very low. This provides a low drop-out voltage for this device.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic cross-section elevation of a conventional nDMOS output driver cell. A central drain nDMOS cell may comprise first and second P− bodies 102(a,b), each P− body 102 having a P+ diffusion 104(a,b) for connection to the P− body 102 and an N+ diffusion 106(a,b) as a source, a N+ diffusion 108 as a central drain, a thin insulating oxide 120(a,b), and insulated gates 110(a,b) over the oxide 120(a,b). Typically, the sources (N+ diffusions) 106 and bodies (P+ diffusions) 104 of the central drain nDMOS cell 100 are connected to a negative supply, while a central drain output terminal 112 is connected to the N+ diffusion 108 central drain of the nDMOS cell 100, and may be used as an open drain driver output. The P− bodies 102 are diffused into an N− well 114, the N-well 114 is fabricated using an N-type buried layer (NBL) 116 layout, and having HV or deep N-wells 118 on either side thereof. Using the NBL 116 structure improves DMOS ESD performance significantly. This is because the NBL 116 can switch current passage from the surface channel region to the bulk NBL during an ESD event, thus, avoiding localized highly damaging ESD current flow in the channel region.

Figure 2:
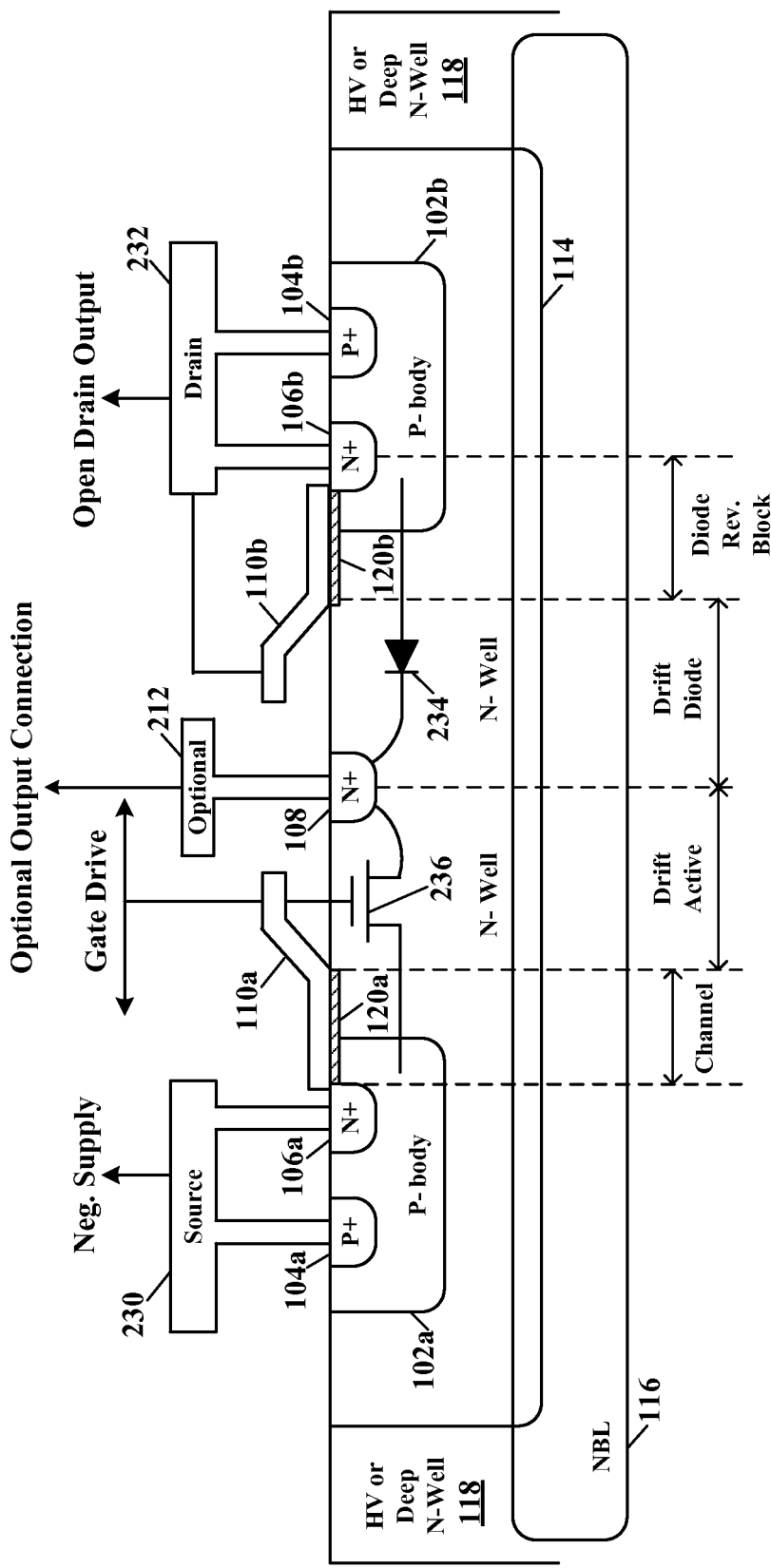
FIGS. 2 and 2A illustrate schematic cross-section elevations of ESD protected and reverse voltage diode blocked output driver cells, according to specific example embodiments of this disclosure.
Figure 2A:
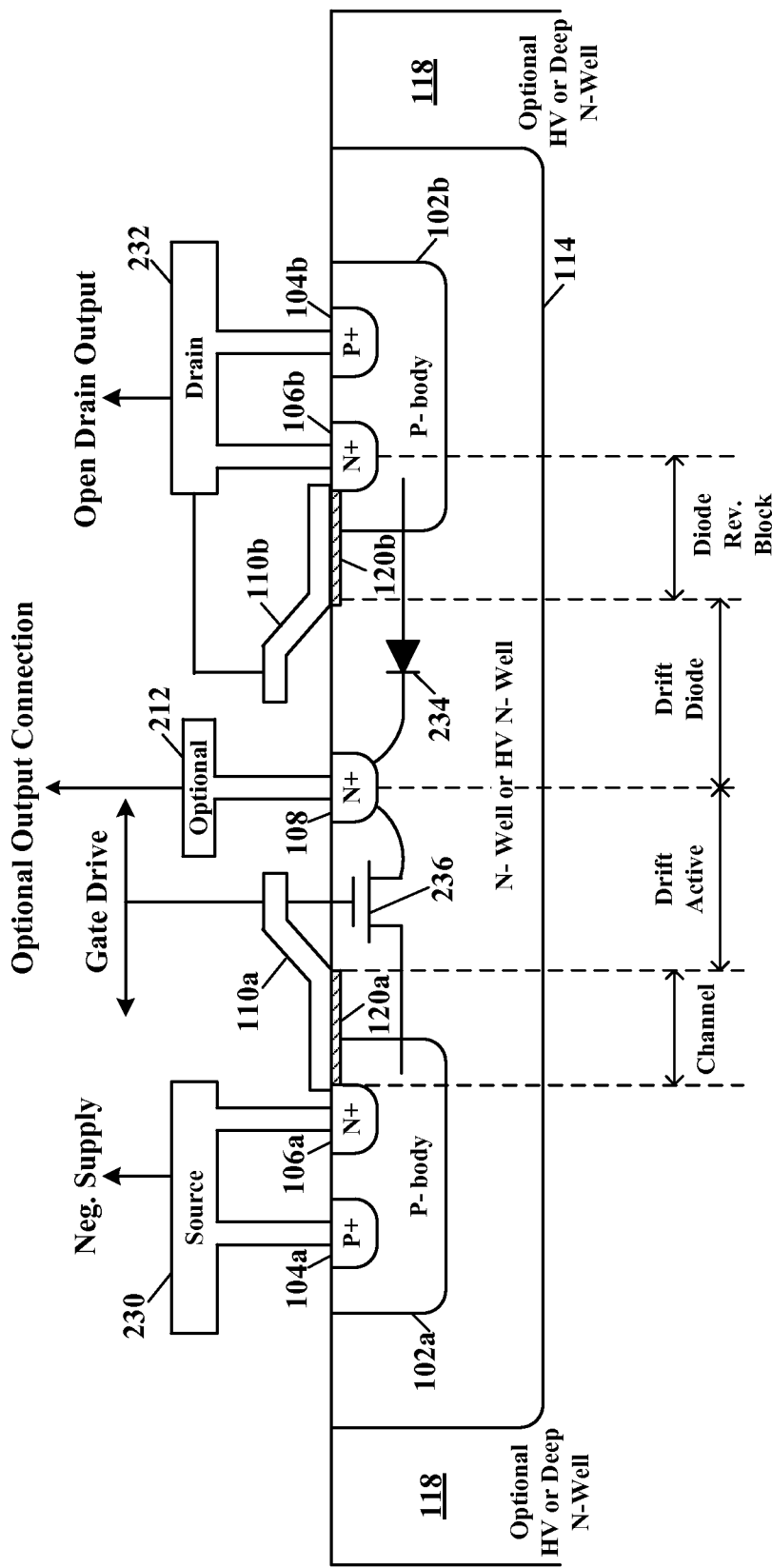

Referring to FIGS. 2 and 2A, depicted are schematic cross-section elevations of ESD protected and reverse voltage diode blocked output driver cells, according to specific example embodiments of this disclosure. The central drain N+ diffusion 108 shown in FIG. 1 may be unused and one of the external terminals 230 may be connected to the negative supply being the main Source while a second external terminal 232 becomes an Open Drain Output. According to an embodiment, the intrinsic drain-to-body diode of the "unused" device may be used as a reverse blocking diode 234. The gate 110a of the DMOS transistor used as a standard DMOS transistor remains the gate terminal 110a of the compact DMOS and reverse blocking diode 234 while the gate 110b of the DMOS transistor used as the reverse blocking diode 234 may be tied to its local body that is now the output 232 of the open drain driver device. An optional drain output connection 212 may be provided for applications requiring an intermediate point between the HVnMOS device 236 drain output and the reverse blocking diode 234. As explained above the buried layer may improve the performance. However it is not mandatory and may be eliminated as shown into FIG. 2A. Therefore this technique applies as well to semiconductor fabrication processes not using a buried layer. For such semiconductor fabrication processes the surrounding HV-well may not be required either.

The intrinsic drain-to-body junction of any HVMOS transistor has a break-down voltage intrinsically higher than the maximum operating voltage of the HV transistor. When this HVMOS transistor is floating, which is the case for DMOS transistors of the SOI process, this intrinsic diode 234 can be used as a HV floating diode. In a bulk or standard CMOS (not SOI) processes the intrinsic diode may become pseudo floating. It may also be considered as the emitter-base junction of a vertical PNP bipolar transistor in a bulk (non SOI) process.

However the beta factor (current gain) of this vertical PNP bipolar transistor is very low in most recent processes and thus this emitter-base junction may be considered as floating. According to an embodiment two HVDMOS transistors may be combined in an anti-series configuration where the drains are merged rather than connected together through metal. This dramatically saves area since DMOS to DMOS distance may be huge.

Moreover the designer doesn't have to fight with current densities in the drain-to drain metal connection between the two drains of independent DMOS transistors. Such two HVDMOS transistors in an anti-series configuration may be inherent to any DMOS device with a central drain. Usually the two body/source terminals may be tied together through a strong metal connection (as required by layout rules) making the global source/body terminal, the two gates are tied together, making the gate terminal, and the central drain is the third terminal (see FIG. 1). However, one of the two body/source terminals may be used as the series reverse blocking diode 234 when totally disconnected from the other body/source terminal (see FIG. 2). This violates the rule requiring that the two body/source terminals be tied together through a strong metal connection, but provides the HVnMOS device 236 and reverse blocking diode 234 according to various embodiments described herein. For electrical reasons, the two gates may be disconnected as well.

Figure 2B:
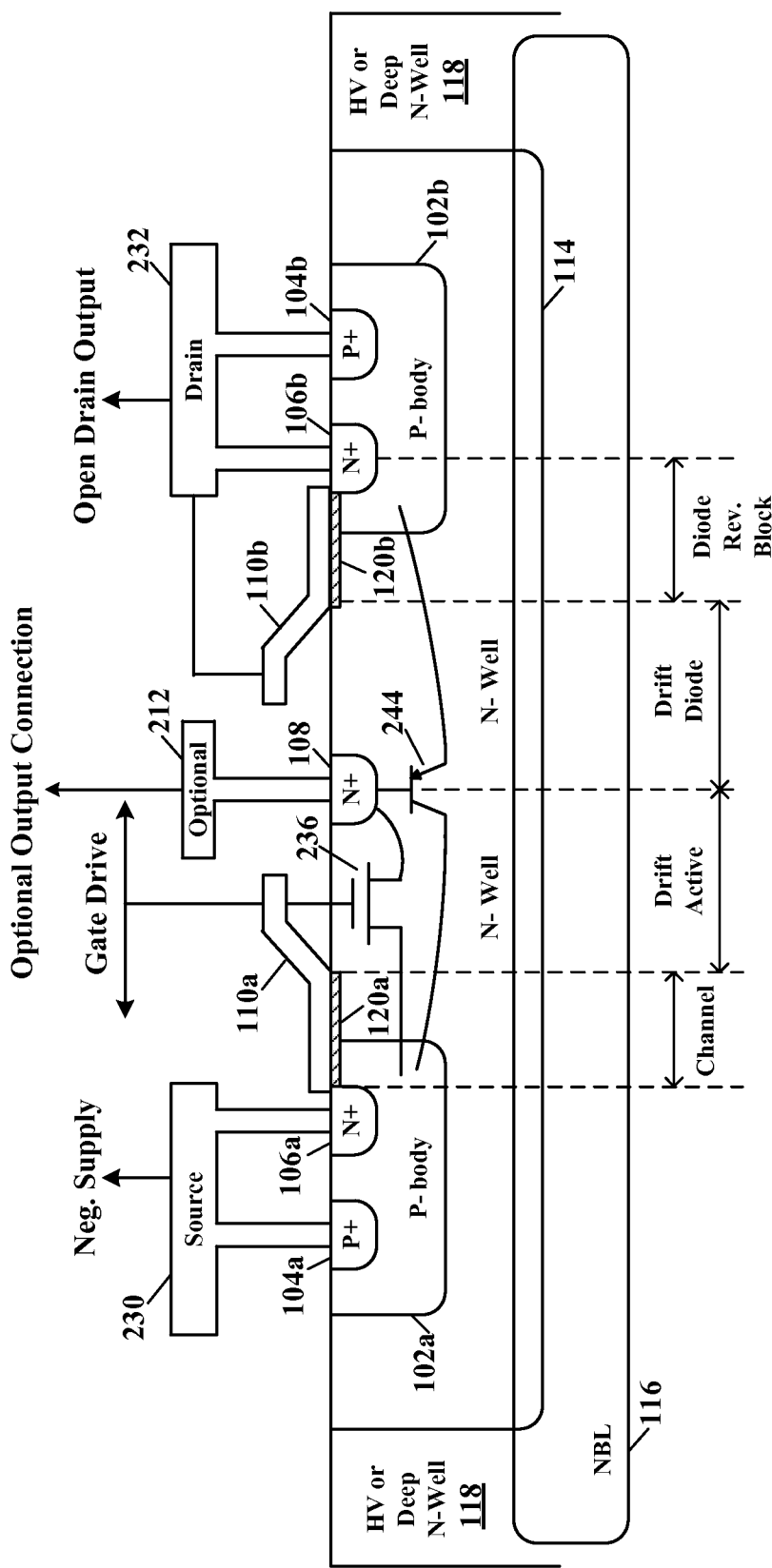
FIG. 2B illustrates a schematic cross-section elevation of an ESD protected and reverse voltage diode blocked output driver cell wherein a lateral PNP device is emphasized, according to another specific example embodiment of this disclosure.

Referring to FIG. 2B, depicted is a schematic cross-section elevation of an ESD protected and reverse diode voltage blocked output driver cell wherein a lateral PNP device is emphasized, according to another specific example embodiment of this disclosure. The floating or pseudo-floating diode 234 may also be considered as the emitter-base junction of a lateral PNP bipolar transistor 244 for which the N-Well is the base and the P-body of the active nDMOS device is the collector. The new HVnMOS device 236 and reverse blocking diode 234/lateral PNP 244 have inherently a PNPN (SCR) structure that renders it sensitive to latch-up. The drain current, flowing in the reverse blocking diode 234/lateral PNP 244, may be the triggering current of this SCR structure. Therefore the designer needs to be very careful driving the gate 110a of the HVnMOS device 236 and reverse blocking diode 234/lateral PNP 244 and ensure that the current flowing in it is always lower than the triggering current of the SCR structure. At a first glance, limiting the drain current looks to be a drawback of this approach. But practically, this drain current flowing in the reverse blocking diode 234/emitter-base junction of a lateral PNP bipolar transistor 244 is in fact the base current of the lateral PNP device 244. The collector current of this lateral PNP device 244, which is collected by the body of the active nDMOS, adds to the active nDMOS current thereby boosting the overall drive capability of the device. Thus this new device becomes very efficient compared to a standard nDMOS device. The same applies to the nDMOS in the SOI process, whereas in the case of the pDMOS in the SOI process the bipolar transistor is now a NPN type. Therefore this limitation is minor compared to the benefits of the bipolar gain on the overall drive capability plus SCR structure in case of an ESD event: the SCR structure confers excellent ESD robustness to this device rendering it self-protected. Thus the new HVnMOS device 236 and reverse blocking diode 234 saves area of the ESD protection. Moreover, the structure is symmetrical and self-protects for both positive and negative ESD events.

Usually an ESD protection bypasses the ESD current to the ground node (pin). A popular solution for implementing the protection is using the drain of a wide enhancement nMOS device having its gate, source and body nodes tied to the ground pin. Such a device is "off" since its gate is shorted to its source/body node. Thus it looks like a standard ESD diode. However it often provides better flexibility and/or ESD robustness than a standard ESD diode. This is why it is very popular. The commonly used name for such an ESD protection is Grounded Gate nMOS ("GGnMOS") since the gate of this device is connected, as well as its source/body node, to the ground node (pin). In practice the ESD protection may bypass the ESD current to a different node (pin) than the ground node (pin). By similitude to the previous description any protection based on the drain of wide nMOS device having its gate, source and body nodes tied together to a supply node (pin) that will collect the ESD current is called a GGnMOS protection.

By extension, the term GGnDMOS may be used herein when an nDMOS transistor has its gate and source/body nodes tied together to function as an ESD protection circuit. Similarly the term GGpMOS and GGpDMOS may be used herein when a pMOS or a pDMOS has its gate, source and body nodes tied together to a supply node (pin) to also function as ESD protection circuit.

Several studies have shown that the efficiency of a GGnMOS and GGnDMOS (GGpMOS and GGpDMOS) may be improved by not connecting the gate directly to the source/body node, but rather through a resistor or a triggering circuit. These studies are readily available about information on such technique in the public domain.

Figure 2C:
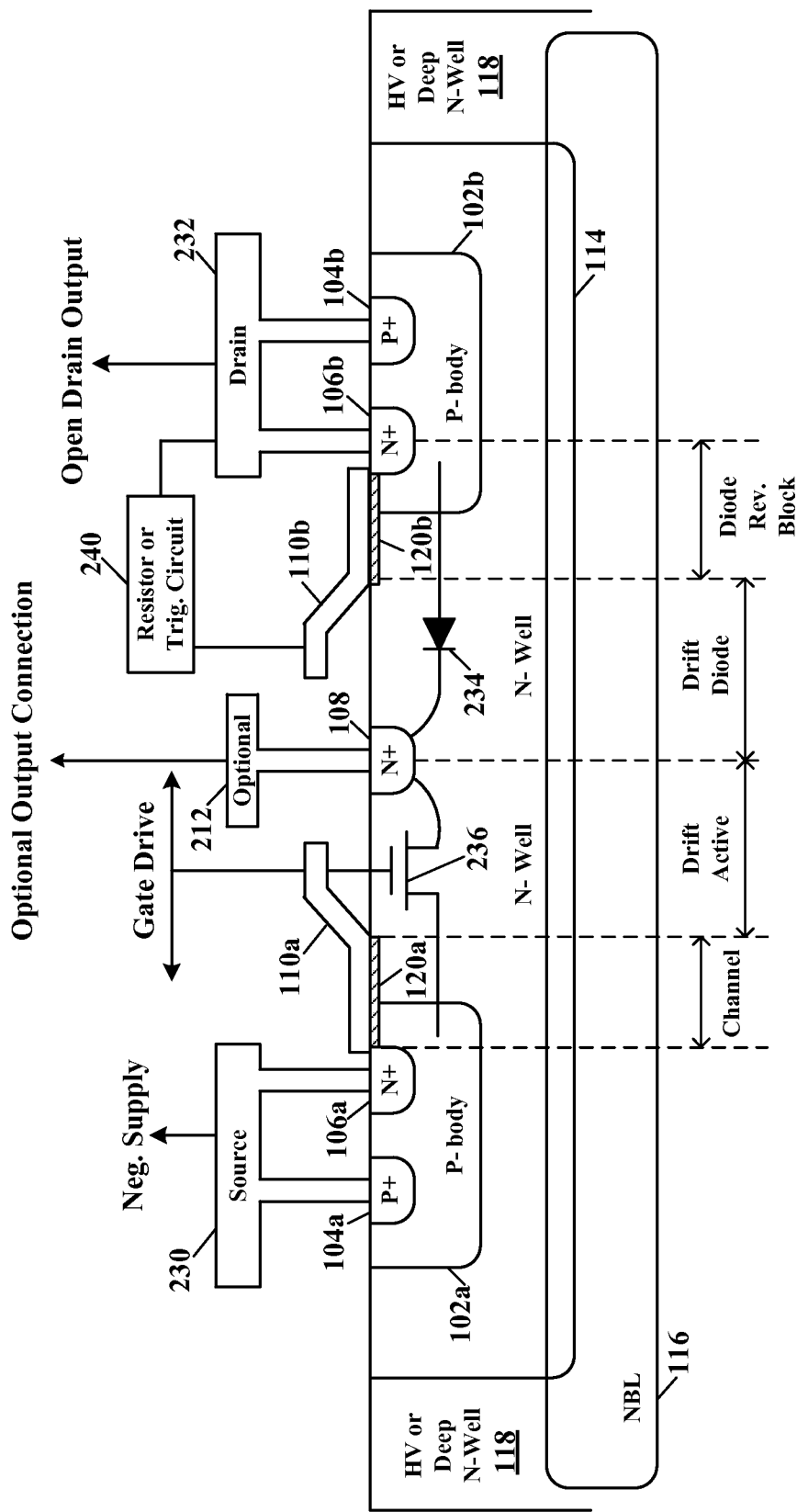
FIG. 2C illustrates a schematic cross-section elevation of an ESD protected and reverse voltage diode blocked output driver cell wherein a resistor or a triggering circuit connects the gate of the nDMOS used as the reverse voltage blocking diode to its source/body that is the output of the proposed device (the Open Drain output), according to still another specific example embodiment of this disclosure.

Referring to FIG. 2C, depicted is a schematic cross-section elevation of an ESD protected and reverse voltage diode blocked output driver cell wherein a resistor or a triggering circuit 240 connects the gate of the nDMOS used as the reverse voltage blocking diode to its source/body that is the output of the proposed device (the Open Drain output), according to still another specific example embodiment of this disclosure. By connecting the gate 110b of the nDMOS used as the reverse blocking diode to the output through a resistor or a triggering circuit 240, rather than simply connecting a shorting conductor there between, one will further improve the robustness of the protection for negative ESD events.

When considering an nDMOS and reverse blocking device, during a positive ESD event, the nDMOS section of the new device acts as a GGnDMOS device used for standard HV ESD protection. The drain voltage increases until it reaches the triggering (snap-back) threshold of the protection. Before reaching the triggering point, the drain current of the nDMOS is too small to trigger the SCR structure. But as soon as the drain voltage reaches the triggering point, the drain current increases dramatically and becomes large enough to trigger the SCR. From this point the SCR is "on" with very high conductance and clamps to ground the ESD current.

During a negative ESD event, things are inverted. The nDMOS section of the new device becomes the forward biased diode, as well as the triggering element of the SCR device, while the reverse blocking diode becomes the active GGnDMOS element. Here it really acts as a GGnDMOS ESD protection since its gate is tied to its source/body node as described hereinabove. As long as the voltage across the GGnDMOS device is less than the triggering voltage of the SCR, its drain current is less than the triggering current of the SCR and the SCR is "off." But as soon as the triggering voltage is reached, the drain current of the GGnDMOS suddenly increases turning "on" the SCR.

Figure 2D:
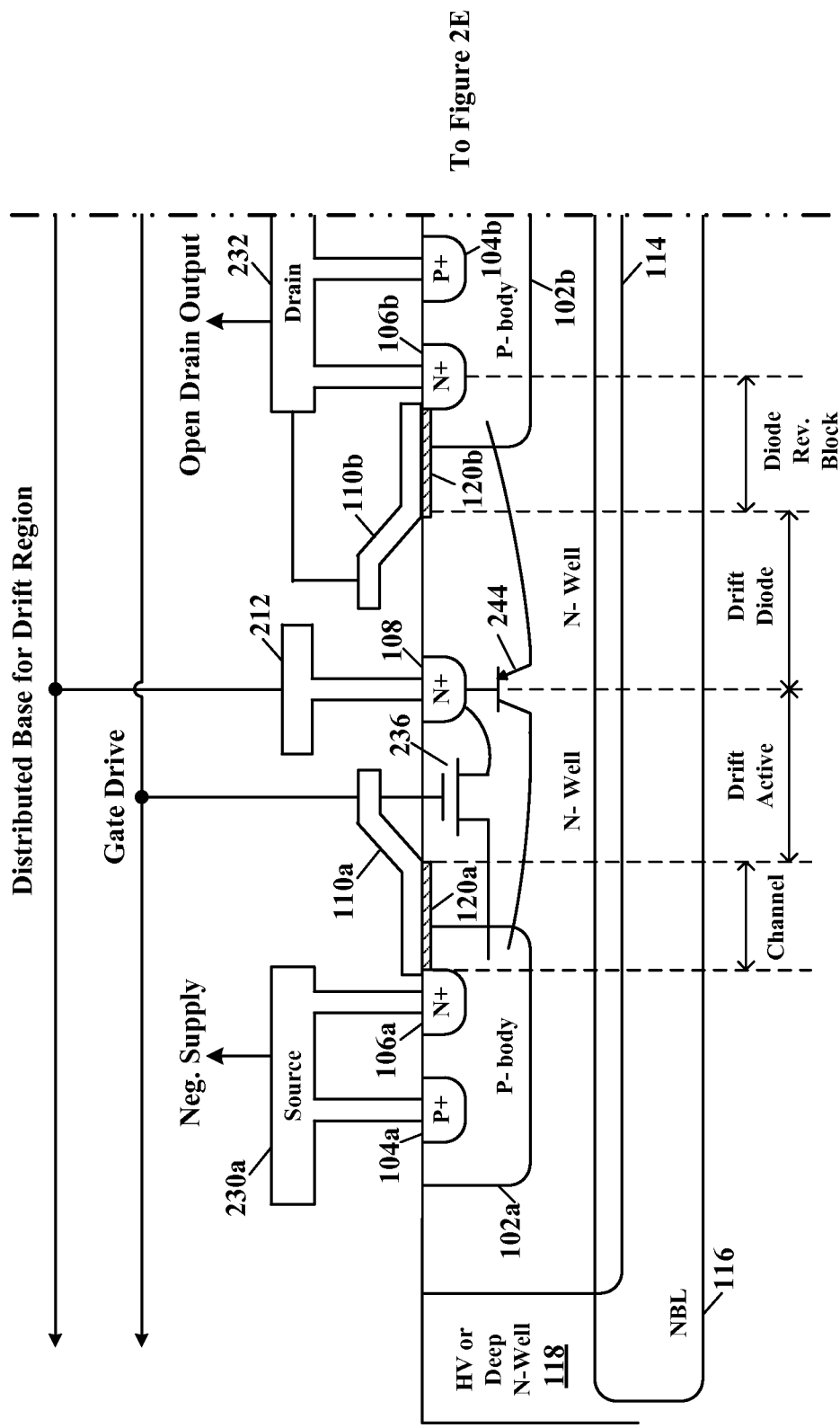
FIGS. 2D and 2E in combination illustrate a schematic cross-section elevation of ESD protected and reverse voltage diode blocked output driver cells having a distributed base connection in a multi-finger structure, according to another specific example embodiment of this disclosure.
Figure 2E:
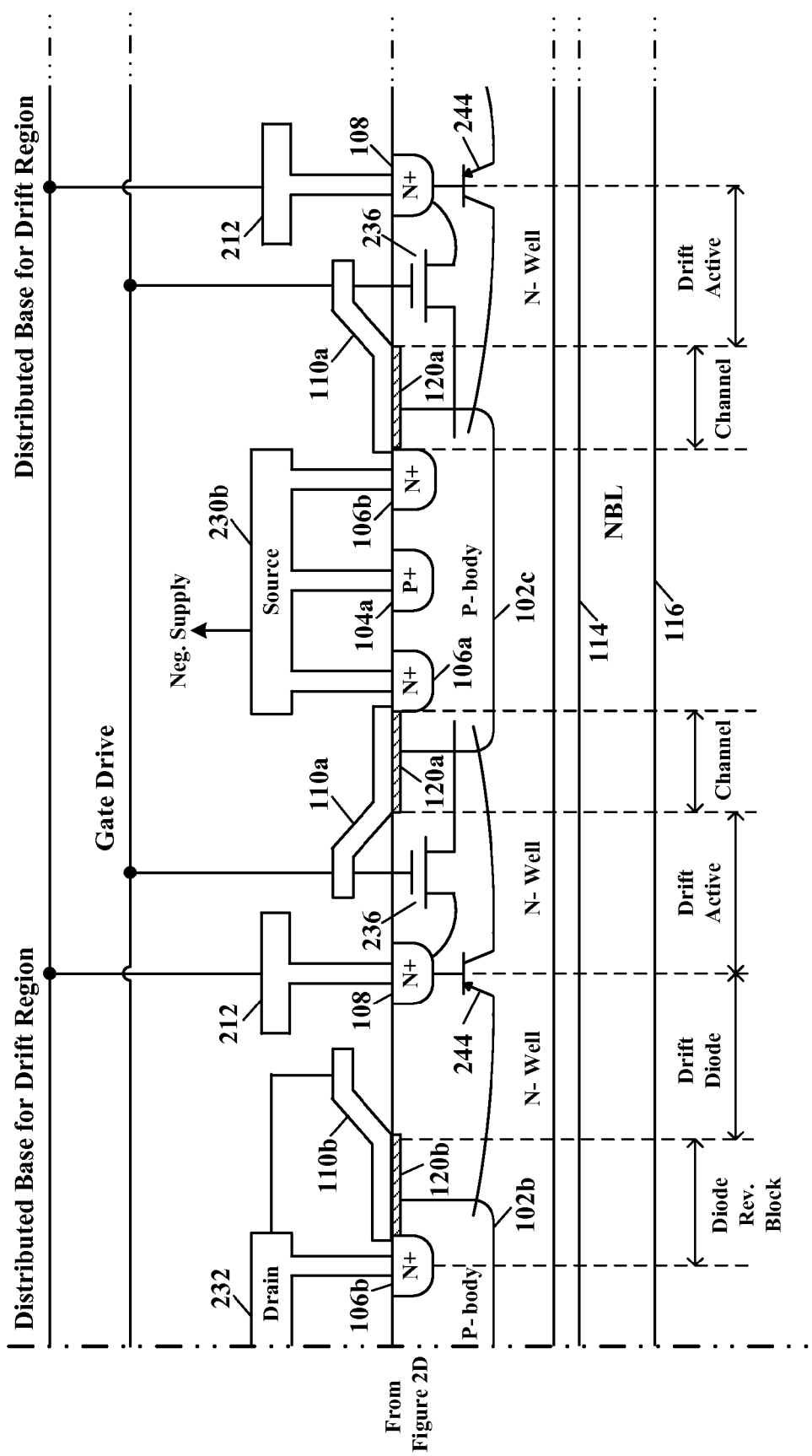

Referring to FIGS. 2D and 2E, depicted in combination is a schematic cross-section elevation of ESD protected and reverse voltage blocking diode output driver cells having a distributed base connection in a multi-finger structure, according to another specific example embodiment of this disclosure. Usually the compact structure will be preferred. However, in order further improving the ESD robustness, FIGS. 2D and 2E show how an optional output connection 212 may be used for connecting together all the bases of each individual lateral PNP 244 associated with each finger. This connection is further called a distributed base connection in a multi-finger structure as more fully described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux, and incorporated by reference herein for all purposes. The optional connection 212 to the common drift region is the base contact of the lateral PNP device 244 described into FIG. 2B. This lateral PNP device is present for each finger of the multi fingers. Shorting together the bases of each of the PNP devices 244 through a strong metal distributed base connection ensures that the first finger triggering will fire the other fingers through this distributed base connection during an ESD event.

Figure 3:
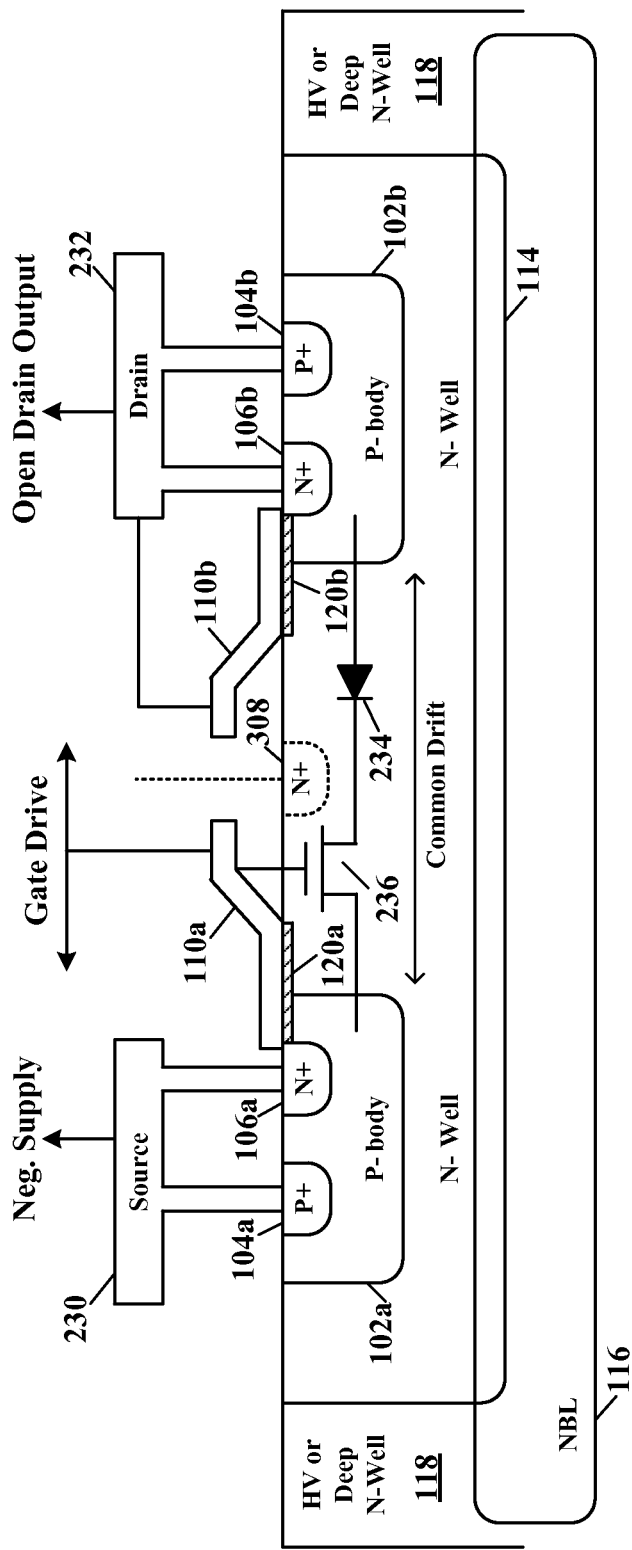
FIG. 3 illustrates a schematic cross-section elevation of an ESD protected and reverse voltage diode blocked output driver cell without an optional output connection, according to another specific example embodiment of this disclosure.
Figure 3A:
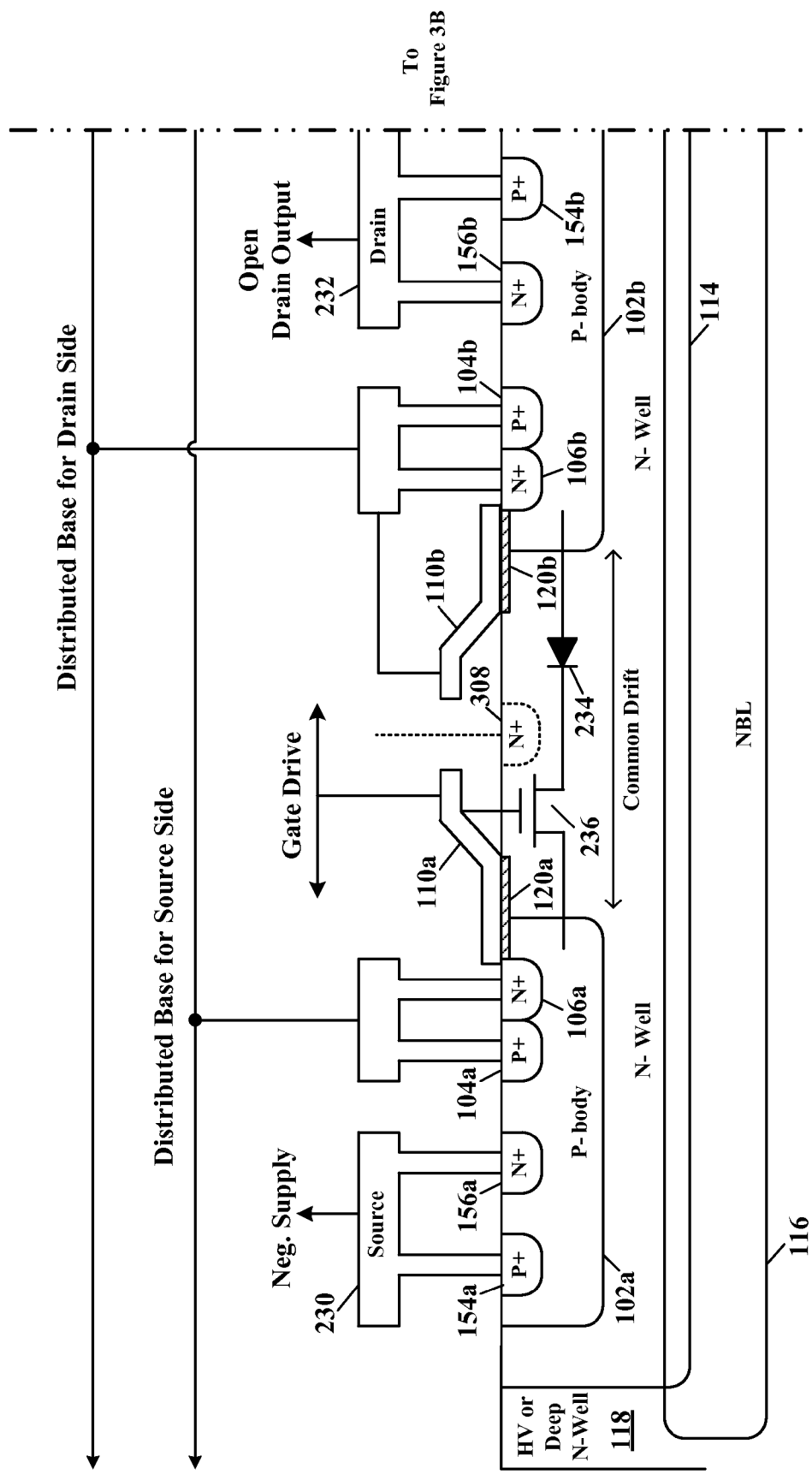
FIGS. 3A and 3B in combination illustrate a schematic cross-section elevation of an ESD protected and reverse voltage diode blocked output driver cell having distributed base connections in a multi-finger structure, according to yet another specific example embodiment of this disclosure.
Figure 3B:
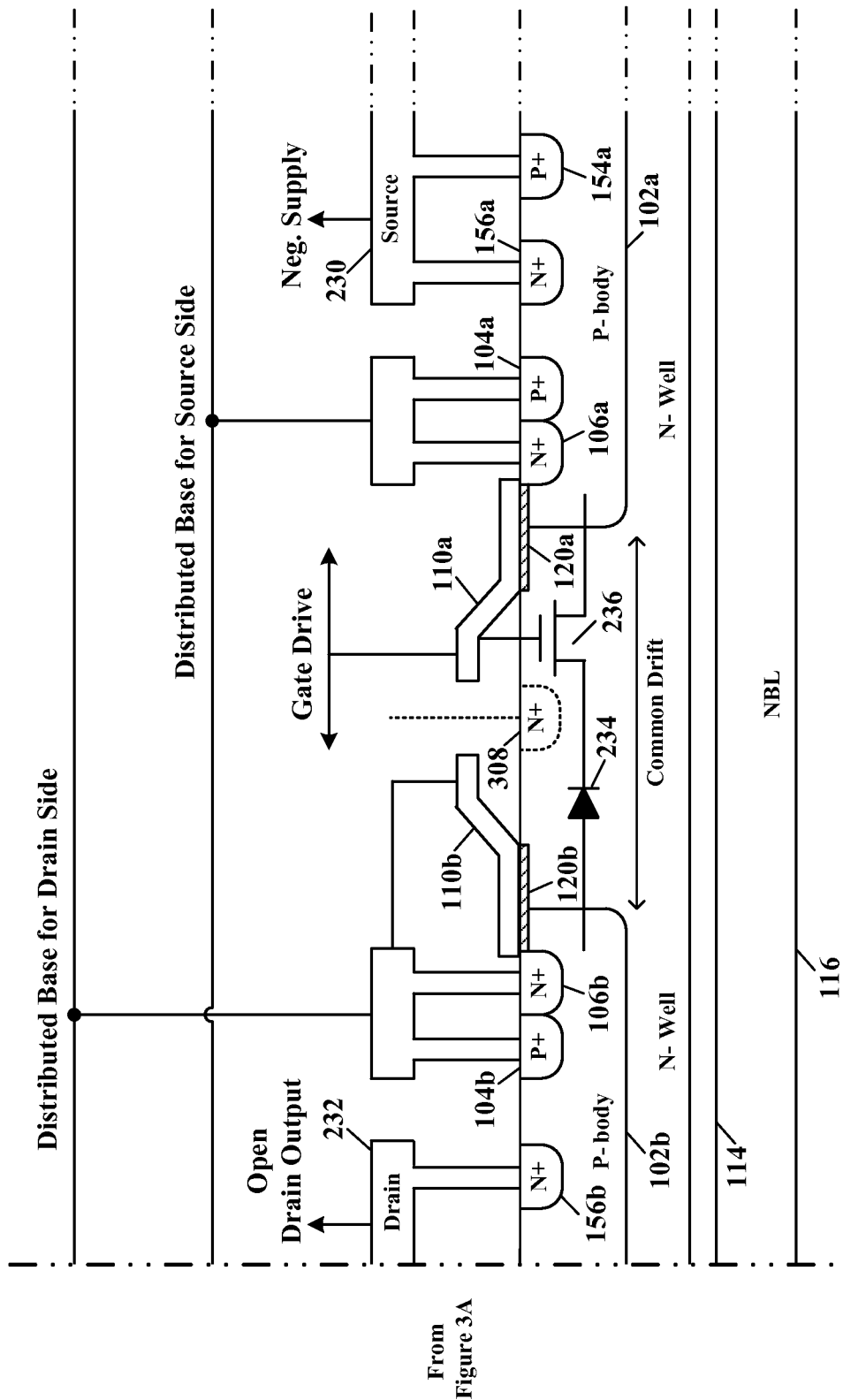

Referring to FIGS. 3, 3A and 3B, depicted are schematic cross-section elevations of an ESD protected and reverse voltage diode blocked output driver cell without an optional output connection (FIG. 3) and having distributed base connections in a multi-finger structure (FIGS. 3A and 3B), according to yet another specific example embodiments of this disclosure. These embodiments may be advantageous for applications not requiring access to the intermediate drain N+ diffusion 308 between the HVnMOS device 236 drain output and the reverse blocking diode 234. In this embodiment the unused drain N+ diffusion 308 may be removed and the distance between P-bodies 102 set to a minimum. Another way for implementing the distributed base technique described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux, while maintaining the compact structure is shown in FIGS. 3A and 3B. Now two distributed base connections, one for the source side and one for the drain side may be added. Usually when this approach is applied the two distributed base connections will be implemented in order keeping as symmetrical as possible behavior between positive and negative ESD events.

On the source side, the N+ diffusion local source 106a and P+ diffusion 104a are no longer connected to the negative supply but to the source-side distributed base connection. An N+ diffusion 156a and a P+ diffusion 154a connected to the negative supply are added close to the local N+ source diffusion 106a and P+ diffusion 104a in order implementing the return path of the ESD current to the negative supply. Detailed operation of this structure is described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux.

On the drain side, the N+ diffusion local drain 106b and P+ diffusion 104b are no longer connected to the drain output but to the drain-side distributed drain connection. An N+ diffusion 156b and a P+ diffusion 154b connected to the drain output are added close to the local N+ drain diffusion 106b and P+ diffusion 104b in order collecting the output drain current. As explained above this structure is active during negative ESD discharge.

Any parallel combination of the above described ESD improvement techniques may be applied by one having ordinary skill in integrated circuit design and the benefit of this disclosure, and is contemplated herein.

At a first glance, the proposed structure is symmetrical and thus should have the same positive and negative threshold for ESD events. However the gate driving of the active nDMOS section and the reverse blocking section are different. The active nDMOS has its gate controlled through an external driver while the nDMOS used in the reverse blocking section has its gate tied to its source/body that is the output, directly or through a resistor or a triggering circuit. Therefore, the impedances seen by the gate of the nDMOS used in the active section and by the gate of the nDMOS used in the reverse blocking section are different. A person of ordinary skill in the art of integrated circuit design will know that the impedance seen by the gate of the nMOS or nDMOS (pMOS or pDMOS) used as ESD protection has slight impact on the triggering point of the protection and having the benefit of this disclosure. As a consequence of this gate impedance difference, the triggering voltage for positive and negative ESD events will not be perfectly symmetrical but will differ slightly.

Figure 4:
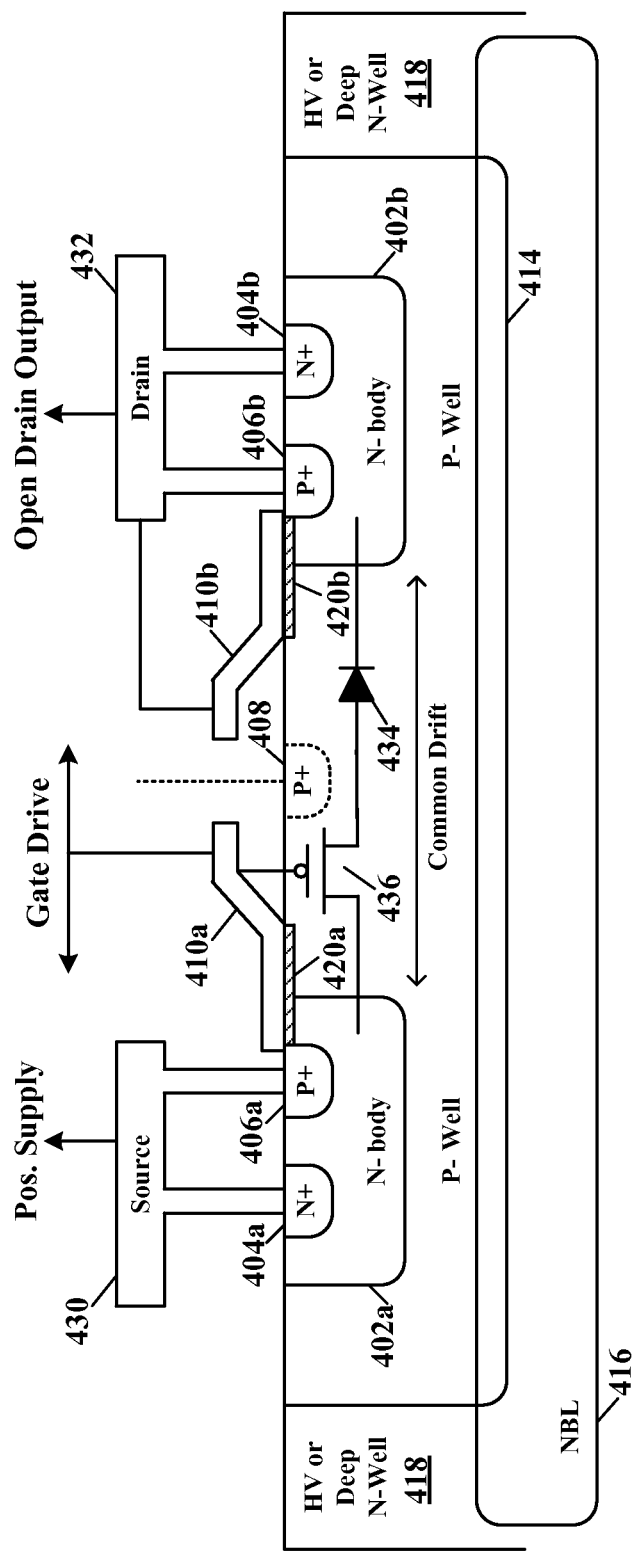
FIG. 4 illustrates a schematic cross-section elevation of an ESD protected and reverse voltage diode blocked pDMOS output driver cell, according to yet another specific example embodiment of this disclosure.

For conventional bulk process, the above technique may only apply to nDMOS. But for triple-well, multi-well or SOI process it applies as well to pDMOS. FIG. 4 shows and the description below describes how this technique may be implemented for pDMOS.

Referring to FIG. 4, depicted is a schematic cross-section elevation of an ESD protected and reverse voltage diode blocked pDMOS output driver cell, according to yet another specific example embodiment of this disclosure. A deep P-well 414 may comprise first and second shallow N-wells used as N− bodies 402(a,b), each N− body 402 having an N+ diffusion 404(a,b) for connection to the N− body 402(a,b) and a P+ diffusion 406(a,b) as a source, a thin insulating oxide 420(a,b), and an insulated gate 410(a,b) over the oxide 420(a,b). Typically, the sources 406a and body 404a of the pDMOS cell shown in FIG. 4 may be connected to a positive supply, while the body 404b (and the source 406b) is the cathode output of the series reverse blocking diode 434. An N-type buried layer (NBL) 416 layout built below the deep P-well 414 isolates the bottom part of the pDMOS cell from the global substrate while HV N-wells (or deep N-well) 418 provide isolation on either side thereof.

Here again the compact structure may be preferred. However as it was described hereinabove for the nDMOS structure, a P+ diffusion 408 (dashed) may be inserted as a local access to the intermediate point between the reverse blocking diode and the pDMOS driver or as a local distributed base contact when implementing as well the triggering technique described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux, and incorporated by reference herein for all purposes. This is now the base contact of an NPN device (dashed).

Figure 4A:
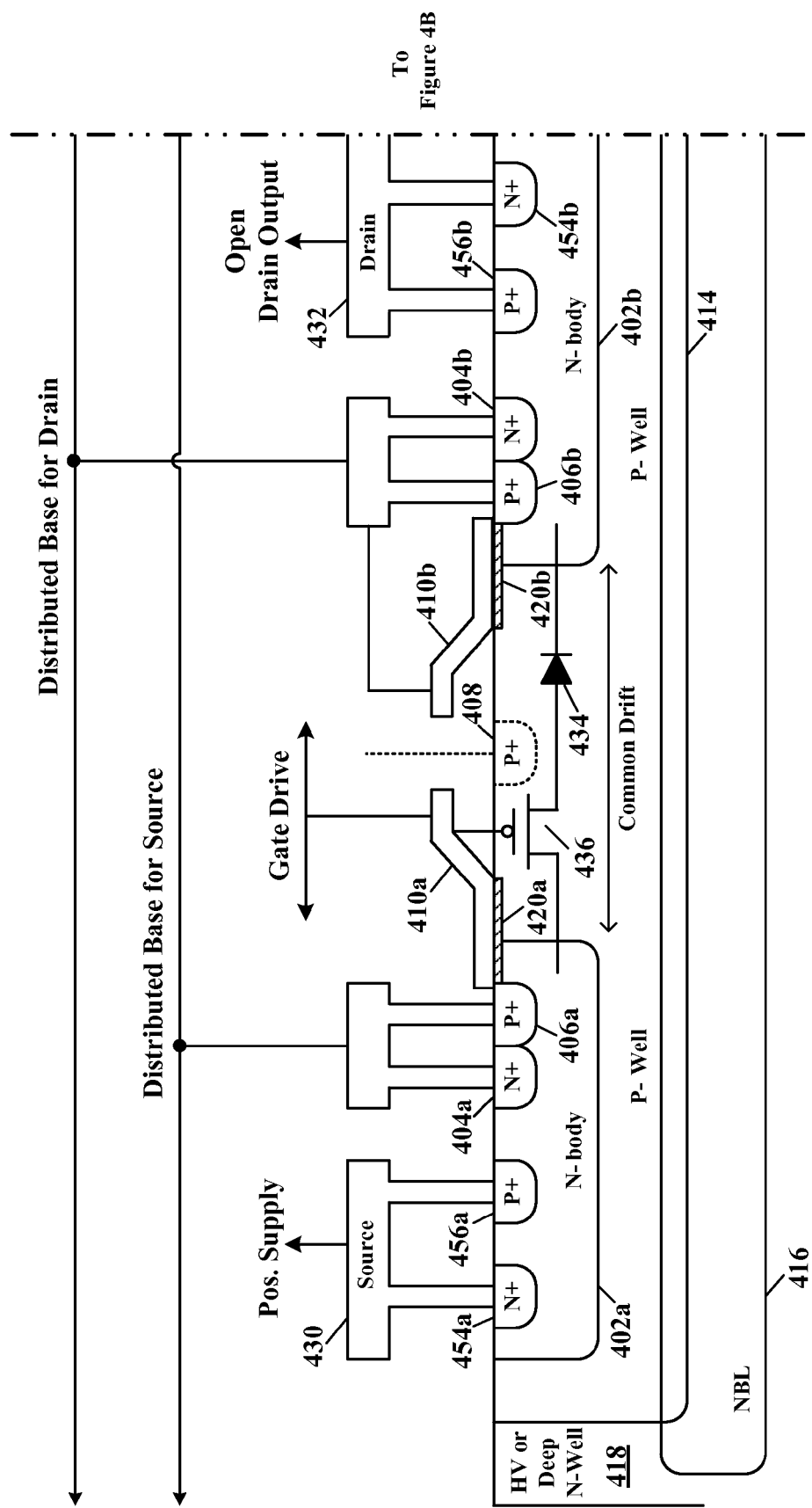
FIGS. 4A and 4B in combination illustrate a schematic cross-section elevation of an ESD protected and reverse voltage diode blocked pDMOS output driver cell having distributed base connections in a multi-finger structure where the compact drain structure is maintained, according to still another specific example embodiment of this disclosure.
Figure 4B:
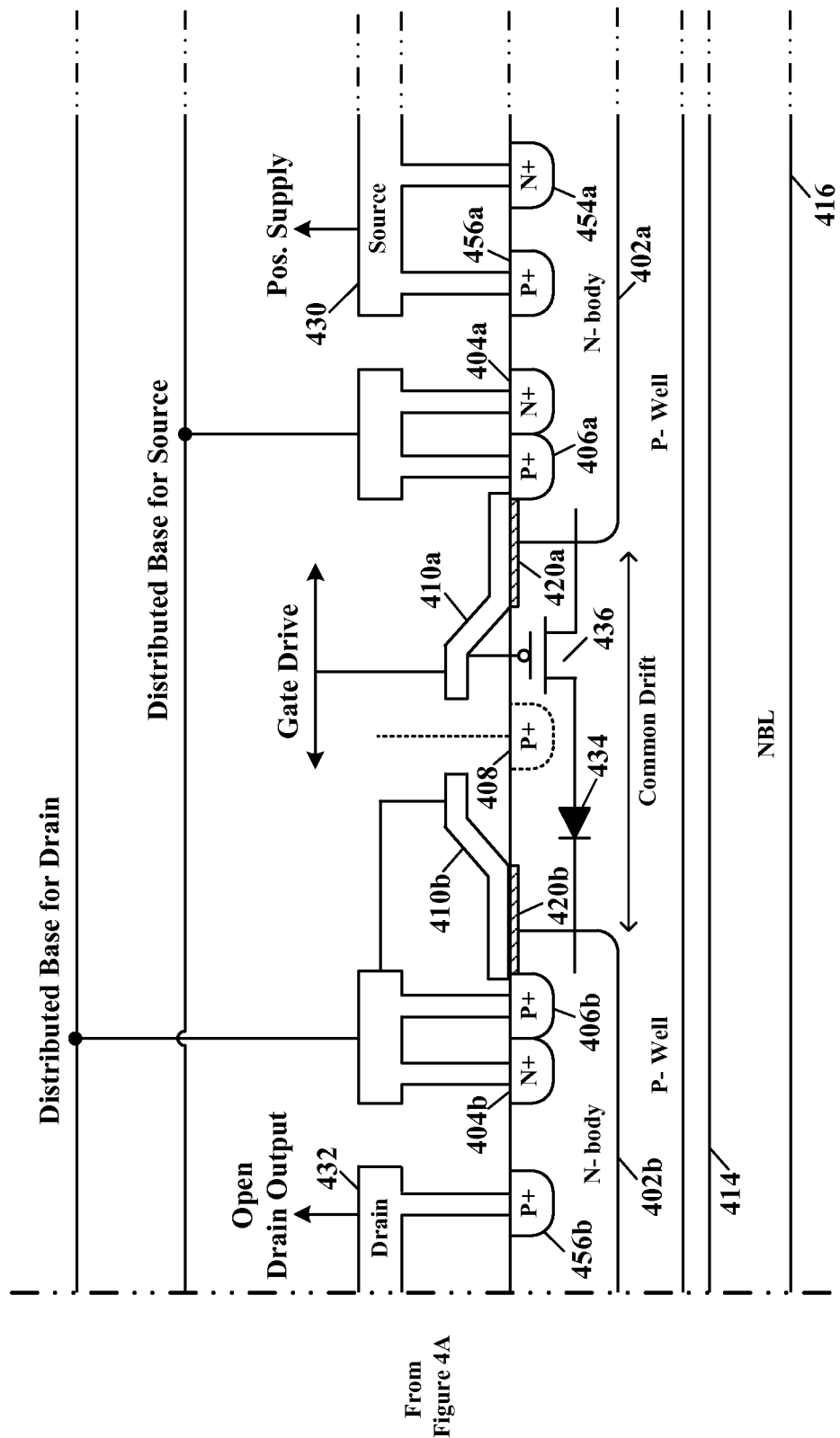

Referring to FIGS. 4A and 4B, depicted in combination is a schematic cross-section elevation of an ESD protected and reverse voltage diode blocked pDMOS output driver cell having distributed base connections in a multi-finger structure where the compact drain structure is maintained, according to still another specific example embodiment of this disclosure. Here again with this alternative way two distributed base connections may be added, one for the source side and one for the drain side. Usually when this approach is applied the two distributed base connections will be implemented in order keeping as symmetrical as possible behavior between positive and negative ESD events.

On the source side, the P+ diffusion local source 406a and N+ diffusion 404a are no longer connected to the positive supply but to the source-side distributed base connection. A P+ diffusion 456a and an N+ diffusion 454a connected to the positive supply are added close to the local P+ source diffusion 406a and N+ diffusion 404a in order to implement the return path of the ESD current to the positive supply. Detailed operation of this structure is described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux. This structure is active during a negative ESD discharge event.

On the drain side, the P+ diffusion local drain 406b and N+ diffusion 404b are no longer connected to the drain output but to the drain-side distributed drain connection. A P+ diffusion 456b and an N+ diffusion 454b connected to the drain output are added close to the local P+ drain diffusion 406b and N+ diffusion 404b in order collecting the output drain current. This structure is active during positive ESD discharge event.

Again, any parallel combination of the above described ESD improvement techniques may be applied and are contemplated herein.

The above descriptions about bulk processes refer to P-type wafers that are currently being used. However it is contemplated and within the scope of this disclosure that one having ordinary skill in the art of integrated circuit design and the benefit of this disclosure may adapt them to N-type wafers.

Figure 5:
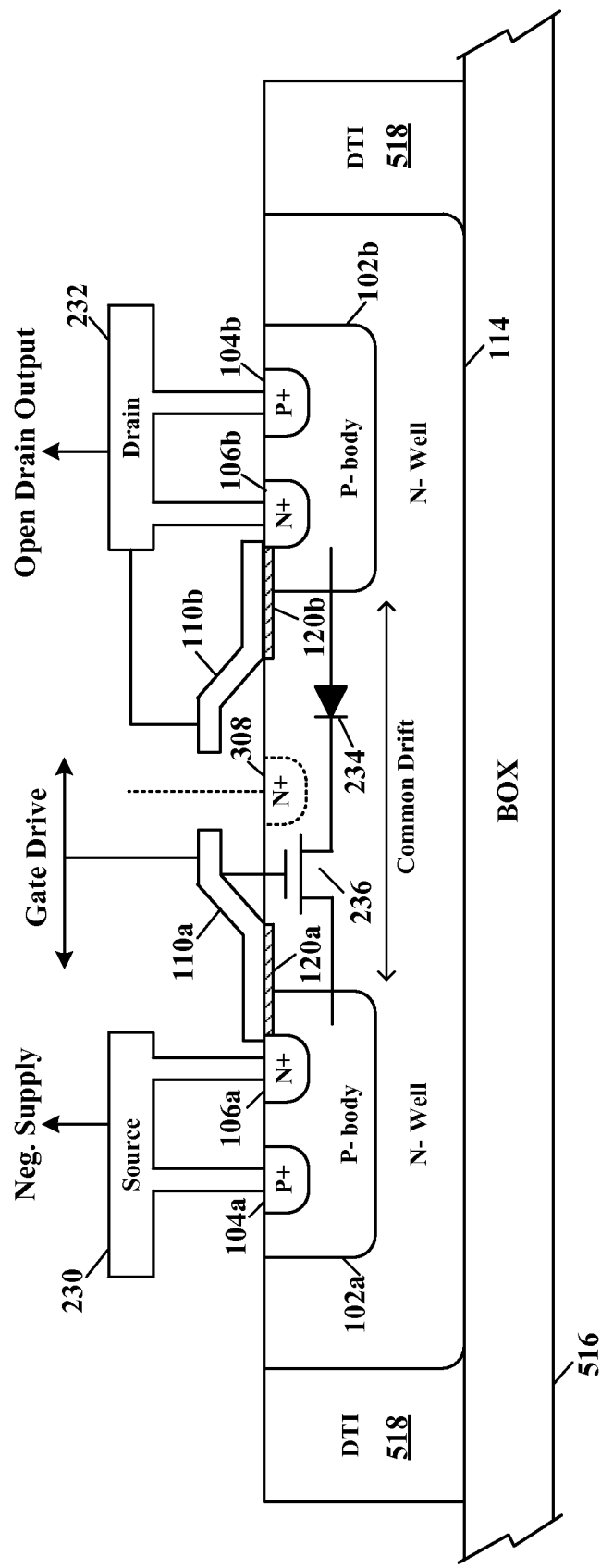
FIG. 5 illustrates a schematic cross-section elevation of an ESD protected and reverse voltage diode blocked nDMOS output driver cell for a SOI process, according to still another specific example embodiment of this disclosure.

Referring to FIG. 5, depicted is a schematic cross-section elevation of an ESD protected and reverse voltage diode blocked nDMOS output driver cell for a SOI process, according to still another specific example embodiment of this disclosure. The nDMOS output driver cell shown in FIG. 5 works in substantially the same as the cells shown in FIGS. 2 and 3 and described herein, but now the NBL 116 is replaced by a Buried OXide (BOX) layer 516 while the HV N-well walls 118 are replaced by Deep Trench Isolation (DTI) 518.

Figure 6:
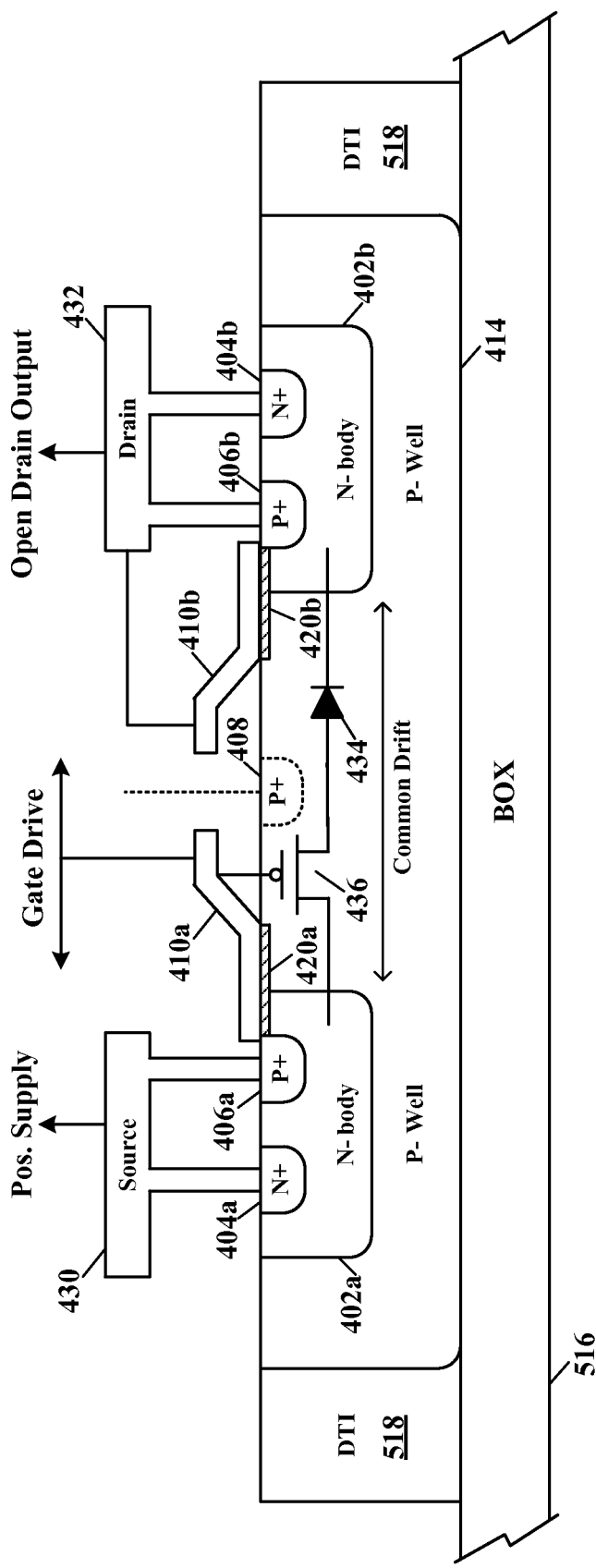
FIG. 6 illustrates a schematic cross-section elevation of an ESD protected and reverse voltage diode blocked pDMOS output driver cell for a SOI process, according to another specific example embodiment of this disclosure.

Referring to FIG. 6, depicted is a schematic cross-section elevation of an ESD protected and reverse voltage diode blocked pDMOS output driver cell for a SOI process, according to another specific example embodiment of this disclosure. The pDMOS output driver cell shown in FIG. 6 works in substantially the same as the cells shown in FIG. 4 and described herein, but now the NBL 116 is replaced by the BOX layer 516 while HV N-well walls 118 are replaced by deep trench isolation (DTI) 518.

Usually the compact structure will be preferred. However, in order to further improve the ESD robustness, a local distributed base contact (Dashed N+ diffusion 308 or P+ diffusion 408) may be inserted as a local distributed base contact when implementing as well the triggering technique described in commonly owned US Pub. No. 2013/0020646 A1, entitled "Multi-Channel Homogenous Path for Enhancing Mutual Triggering of Electrostatic Discharge Fingers," by Philippe Deval, Marija Fernandez and Patrick Besseux, and incorporated by reference herein for all purposes.

All of the gate triggering improvement techniques as well as mutual finger triggering improvement techniques described hereinabove for non-SOI devices may apply as well for SOI devices.

For simplicity, in the above figures and descriptions, the termination body at the edges of the proposed ESD solution in multi-finger structure is always the source body termination. One must note that, depending on layout rules and design constraints; the termination body at the edges of the proposed ESD solution in a multi-finger structure may be either the drain or source termination.

For all of the above described embodiments, the intrinsic drain-to-body diode of a DMOS in a grounded gate configuration is used for implementing the reverse blocking diode. The purpose is to beneficially enhance performance of a GGMOS during ESD events. However the DMOS is always off and thus may be removed. Thus for the reverse blocked nDMOS, both gate 110b and N+ diffusion 106b, or only gate 110b may be removed. This will help in saving fabrication area, but ESD performance may suffer. Higher area savings will be achieved when both gate 110b and N+ diffusion 106b are removed. However keeping the N+ diffusion 106b may help in keeping good ESD performance.

Similarly for the reversed blocked pDMOS both gate 410b and N+ diffusion 406b, or only gate 410b may be removed. Again, higher fabrication area savings will be achieved when both gate 410b and P+ fabrication 406b are removed. However keeping the P+ diffusion 406b may help in keeping good ESD performance.

Using a DMOS transistor as a floating diode 234 is totally unusual and often even forbidden in design rules. Thus conventional designs will use existing diodes in the process. According to various embodiments, a protection circuit as proposed violates such design rules in order to benefit from the GGnDMOS (GGpMOS) capability during ESD events. The further step, using one of the drain-to-body junctions of a central drain DMOS as the reverse blocking diode, in order gaining drive capability, symmetrical SCR behavior and very compact structure is even more non-obvious according to various embodiments described herein.

Global series resistance, in other words the resistance of the HVnMOS device 236 and the reverse blocking diode 234 is minimal. Silicon-controlled-rectifier (SCR) behavior is inherent to this structure and results in a self-protected cell with good ESD robustness. Furthermore, a symmetrical structure for positive and negative ESD events may be provided. There is no routing necessary between the HVnMOS device 236 and the reverse blocking diode 234, a single drift region may be provided for both the HVnMOS device 236 and the reverse blocking diode 234, and no spacing is necessary between the HVnMOS device 236 and reverse blocking diode 234. Furthermore, this layout results in a very compact and cost efficient structure. This structure is compatible with SOI processes and may be applied to both nDMOS and pDMOS with SOI fabrication processes.

The following advantages may be provided according to various embodiments. A very compact hybrid ESD protection may be provided by the ESD self-protected cell and may include a main open drain driver output 232 and the reverse blocking diode 234 having a minimal drain and reverse blocking diode 234 series resistance for a given width (minimal drift spacing). The cell is almost symmetrical for both positive and negative ESD events. The protection circuit may be very compact in a very cost effective cell with well defined DC behavior and ESD robustness.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device comprising:
   a supply voltage connection;
   an open drain output connection; and
   an open drain output driver cell having electro-static discharge protection, comprising:
   an N− well;
   a first P− body diffused in the N− well, wherein the first P− body comprises a first P+ diffusion and a first N+ diffusion;
   a second P− body diffused in the N− well, wherein the second P− body comprises a second P+ diffusion and a second N+ diffusion;
   a first gate and a first insulating oxide over a portion of the first P-body and a portion of the N− well, wherein the first gate provides for control of the output driver cell;
   a second gate and a second insulating oxide over a portion of the second P-body and a portion of the N-well;
   a source and body contact coupled with the supply voltage connection and comprising the first P+ diffusion and the first N+ diffusion connected together; and
   wherein the second P+ diffusion, the second N+ diffusion and the second gate are connected together and connected with the open drain output connection;
   wherein an electro-static discharge (ESD) and reverse voltage protection diode is formed between the first and second P− bodies.

2. The integrated circuit device according to claim 1, wherein the second gate is connected to the second P+ diffusion and the second N+ diffusion through a resistor.

3. The integrated circuit device according to claim 1, wherein the second gate is connected to the second P+ diffusion and the second N+ diffusion through a triggering circuit.

4. The integrated circuit device according to claim 1, wherein an N− well region between regions of the two P-bodies creates a common drift region.

5. The integrated circuit device according to claim 4, wherein the N− well common drift region between the two P-body regions has no diffusion contact, thereby making its structure as narrow as possible.

6. The integrated circuit device according to claim 4, wherein an N+ diffusion contact is inserted into the N− well common drift region.

7. The integrated circuit device according to claim 6, wherein an N+ diffusion contact is inserted into the N− well common drift region and provides access to the N− well common drift region.

8. The integrated circuit device according to claim 6, wherein an N+ diffusion contact is inserted into the N− well common drift region and is connected to a distributed base connection.

9. The integrated circuit device according to claim 1, wherein the supply voltage connection is connected to a negative supply.

10. The integrated circuit device according to claim 1, wherein the first P+ diffusion and the first N+ diffusion are connected to a source side distributed base.

11. The integrated circuit device according to claim 10, further comprising a third P+ diffusion and a third N+ diffusion.

12. The integrated circuit device according to claim 11, wherein the third P+ diffusion and the third N+ diffusion are connected to a negative supply.

13. The integrated circuit device according to claim 1, wherein a drain diffusion of the open drain output cell is unused.

14. The integrated circuit device according to claim 1, wherein the second P+ diffusion and the second N+ diffusion are connected to a drain side distributed base.

15. The integrated circuit device according to claim 14, further comprising a fourth P+ diffusion and a fourth N+ diffusion.

16. The integrated circuit device according to claim 15, wherein the fourth P+ diffusion and the fourth N+ diffusion are connected to the open drain output.

17. The integrated circuit device according to claim 1, wherein the N− well is fabricated on an N-type buried layer (NBL).

18. The integrated circuit device according to claim 1, further comprising high voltage wells surrounding the N− well.

19. The integrated circuit device according to claim 1, wherein the N− well is fabricated on a P-type substrate.

20. The integrated circuit device according to claim 1, wherein the N− well is fabricated on a P-type wafer.

21. The integrated circuit device according to claim 1, wherein the N− well is fabricated on a Buried OXide (BOX) layer.

22. The integrated circuit device according to claim 1, wherein the integrated circuit device comprises a Local Interconnect Network (LIN) bus driver comprising the open drain output driver cell.

23. A protection circuit for an integrated circuit device, comprising:
    a negative supply voltage connection;
    an open drain output connection; and
    a cell comprising two source regions arranged in a substrate of a first conductivity type and each comprising a body diffusion of a second conductivity type comprising a P+ diffusion and an N+ diffusion, and associated gates, wherein a first source region is connected to the negative supply voltage connection and its gate is driven by a control signal, and wherein the second source region is connected with its gate and coupled with the open drain output connection, wherein the second source region acts as the drain output of the cell.

24. The protection circuit according to claim 23, wherein the cell is arranged within a high voltage well.

25. The protection circuit according to claim 24, further comprising a buried layer arranged under the cell.

26. The protection circuit according to claim 23, wherein the second source region forms a reverse blocking diode and the first source region is part of a MOS transistor coupled in series with the reverse blocking diode.

27. The protection circuit according to claim 23, wherein the first and second source region are arranged within a well of a first conductivity type and comprise a body of a second conductivity type into which contact zones of the first and second conductivity type are embedded.

28. The protection circuit according to claim 27, wherein the contact zones of a source region are connected to a metal layer.

29. The protection circuit according to claim 28, wherein the contact zones are connected to the metal layer with metal vias.

30. The protection circuit according to claim 23, wherein the first and second gate are formed as a split gate.

31. A protection circuit for an integrated circuit device, comprising:
    a supply voltage connection;

an open drain output connection; and a cell comprising two lateral MOS transistors with a common drain region and two source regions and associated gates, wherein a first MOS transistor of the two lateral MOS transistors is connected to the supply voltage connection via the first source region and its gate is driven by a control signal, and wherein the second MOS transistor is connected as a diode;

wherein the gate is coupled with the second source region and the open drain output connection; and wherein the second source region is arranged in a substrate of a first conductivity type comprises a body diffusion of a second conductivity type comprising a P+ diffusion and an N+ diffusion, wherein the second source region acts as the drain output of the cell.

32. The protection circuit according to claim 31, wherein the common drain region remains unconnected.

33. The protection circuit according to claim 31, wherein the second MOS transistor forms a reverse blocking diode in series with the first MOS transistor.

34. The protection circuit according to claim 33, wherein a common drain region is adapted to provide access to an intermediate point between the first MOS transistor and the second MOS transistor functioning as the reverse blocking diode.

35. The protection circuit according to claim 31, wherein the cell is arranged within a high voltage well.

36. The protection circuit according to claim 35, further comprising a buried layer arranged under the cell.

37. The protection circuit according to claim 31, wherein the first and second source region are arranged within a well of a first conductivity type and comprise a body of a second conductivity type into which contact zones of the first and second conductivity type are embedded.

38. The protection circuit according to claim 37, wherein the contact zones of a source region are connected to a metal layer.

39. The protection circuit according to claim 38, wherein the contact zones are connected to the metal layer with metal vias.

40. The protection circuit according to claim 31, wherein the gates of the first and second MOS transistor are formed as a split gate.

41. The protection circuit according to claim 31, wherein the supply voltage is positive.

42. The protection circuit according to claim 31, wherein the supply voltage is negative.

43. An integrated circuit device comprising:
an external source connection;
an external open drain output connection; and
an open drain output driver cell having electro-static discharge protection, comprising:
an N– well;
a first P– body diffused in the N– well, wherein the first P– body comprises a first P+ diffusion and a first N+ diffusion connected with the external source connection;
a second P– body diffused in the N– well, wherein the second P– body comprises a second P+ diffusion;
a gate and an insulating oxide over a portion of the first P-body and a portion of the N– well, wherein the gate provides for control of the output driver cell; and
the second P+ diffusion is connected with the external open drain output connection and provides a connection to the output of the driver cell;
wherein an electro-static discharge (ESD) and reverse voltage protection diode is formed between the first and second P– bodies.

44. The protection circuit according to claim 43, wherein a second N+ diffusion is implemented into the second P– body.

45. The protection circuit according to claim 44, wherein the second P+ diffusion and the second N+ diffusion are connected together to provide a connection for the output of the driver cell.

46. The open drain output driver cell according to claim 1, wherein the second gate is directly connected to the second P+ diffusion and the second N+ diffusion.

* * * * *